(12) United States Patent
Pelz et al.

(10) Patent No.: US 7,940,034 B2
(45) Date of Patent: May 10, 2011

(54) APPARATUS FOR DETECTING A STATE OF OPERATION OF A POWER SEMICONDUCTOR DEVICE

(75) Inventors: Georg Pelz, Ebersberg (DE); Michael Lenz, Zorneding (DE); Matthias Kunze, Neubiberg (DE)

(73) Assignee: Infineon Technologies Austria AG, Villach (AT)

( * ) Notice: Subject to any disclaimer, the term of this patent is extended or adjusted under 35 U.S.C. 154(b) by 390 days.

(21) Appl. No.: 12/123,105

(22) Filed: May 19, 2008

(65) Prior Publication Data

US 2009/0284305 A1   Nov. 19, 2009

(51) Int. Cl.
*G05F 1/40* (2006.01)
(52) U.S. Cl. ......................................... 323/284; 323/283
(58) Field of Classification Search .................. 323/222, 323/223, 225, 268, 271, 282–285; 361/18, 361/103, 106

See application file for complete search history.

(56) References Cited

U.S. PATENT DOCUMENTS

| | | | | |
|---|---|---|---|---|
| 5,932,938 A * | 8/1999 | Shimamori | .................... | 307/125 |
| 6,052,268 A * | 4/2000 | Thomas | ........................ | 361/103 |
| 6,608,977 B2 * | 8/2003 | Tamaoki | ......................... | 399/69 |
| 6,954,054 B2 * | 10/2005 | Brown | ........................... | 323/283 |
| 7,095,847 B2 * | 8/2006 | Tsuruya et al. | .......... | 379/399.02 |
| 7,741,825 B2 * | 6/2010 | Lenz | ............................ | 323/284 |
| 7,758,240 B2 * | 7/2010 | Júlio et al. | .................... | 374/178 |

\* cited by examiner

*Primary Examiner* — Matthew V Nguyen
(74) *Attorney, Agent, or Firm* — Slater & Matsil, L.L.P.

(57) ABSTRACT

An embodiment of the invention relates to an apparatus including a power semiconductor device and a processor coupled thereto. The processor is configured to provide a control signal to the power semiconductor device to regulate an output characteristic of the apparatus. The processor models an internal characteristic of the power semiconductor device and alters the control signal if the modeled internal characteristic crosses a threshold value. In an exemplary embodiment, the internal characteristic is a channel temperature of a MOSFET. A sensor such as a thermistor is coupled to or included within the processor to sense a parameter separate from the power semiconductor device, such as a processor temperature, and the processor is configured to adapt the modeled internal characteristic to the sensed parameter.

28 Claims, 5 Drawing Sheets

| $V_{gs}$ \ $V_{ds}$ | 0.0 | 1.0 | 2.0 | 3.0 | 4.0 | 5.0 | 6.0 | 7.0 | 8.0 | 9.0 | 10.0 | 11.0 | 12.0 | 13.0 | 14.0 | 15.0 |
|---|---|---|---|---|---|---|---|---|---|---|---|---|---|---|---|---|
| 0.0 | 0x100 | 0x101 | 0x102 | 0x103 | 0x104 | 0x105 | 0x106 | 0x107 | 0x108 | 0x109 | 0x10A | 0x10B | 0x10C | 0x10D | 0x10E | 0x10F |
| 1.0 | 0x110 | 0x111 | 0x112 | 0x113 | 0x114 | 0x115 | 0x116 | 0x117 | 0x118 | 0x119 | 0x11A | 0x11B | 0x11C | 0x11D | 0x11E | 0x11F |
| 2.0 | 0x120 | 0x121 | 0x122 | 0x123 | 0x124 | 0x125 | 0x126 | 0x127 | 0x128 | 0x129 | 0x12A | 0x12B | 0x12C | 0x12D | 0x12E | 0x12F |
| 3.0 | 0x130 | 0x131 | 0x132 | 0x133 | 0x134 | 0x135 | 0x136 | 0x137 | 0x138 | 0x139 | 0x13A | 0x13B | 0x13C | 0x13D | 0x13E | 0x13F |
| 4.0 | 0x140 | 0x141 | 0x142 | 0x143 | 0x144 | 0x145 | 0x146 | 0x147 | 0x148 | 0x149 | 0x14A | 0x14B | 0x14C | 0x14D | 0x14E | 0x14F |
| 5.0 | 0x150 | 0x151 | 0x152 | 0x153 | 0x154 | 0x155 | 0x156 | 0x157 | 0x158 | 0x159 | 0x15A | 0x15B | 0x15C | 0x15D | 0x15E | 0x15F |
| 6.0 | 0x160 | 0x161 | 0x162 | 0x163 | 0x164 | 0x165 | 0x166 | 0x167 | 0x168 | 0x169 | 0x16A | 0x16B | 0x16C | 0x16D | 0x16E | 0x16F |
| 7.0 | 0x170 | 0x171 | 0x172 | 0x173 | 0x174 | 0x175 | 0x176 | 0x177 | 0x178 | 0x179 | 0x17A | 0x17B | 0x17C | 0x17D | 0x17E | 0x17F |
| 8.0 | 0x180 | 0x181 | 0x182 | 0x183 | 0x184 | 0x185 | 0x186 | 0x187 | 0x188 | 0x189 | 0x18A | 0x18B | 0x18C | 0x18D | 0x18E | 0x18F |
| 9.0 | 0x190 | 0x191 | 0x192 | 0x193 | 0x194 | 0x195 | 0x196 | 0x197 | 0x198 | 0x199 | 0x19A | 0x19B | 0x19C | 0x19D | 0x19E | 0x19F |
| 10.0 | 0x1A0 | 0x1A1 | 0x1A2 | 0x1A3 | 0x1A4 | 0x1A5 | 0x1A6 | 0x1A7 | 0x1A8 | 0x1A9 | 0x1AA | 0x1AB | 0x1AC | 0x1AD | 0x1AE | 0x1AF |
| 11.0 | 0x1B0 | 0x1B1 | 0x1B2 | 0x1B3 | 0x1B4 | 0x1B5 | 0x1B6 | 0x1B7 | 0x1B8 | 0x1B9 | 0x1BA | 0x1BB | 0x1BC | 0x1BD | 0x1BE | 0x1BF |
| 12.0 | 0x1C0 | 0x1C1 | 0x1C2 | 0x1C3 | 0x1C4 | 0x1C5 | 0x1C6 | 0x1C7 | 0x1C8 | 0x1C9 | 0x1CA | 0x1CB | 0x1CC | 0x1CD | 0x1CE | 0x1CF |
| 13.0 | 0x1D0 | 0x1D1 | 0x1D2 | 0x1D3 | 0x1D4 | 0x1D5 | 0x1D6 | 0x1D7 | 0x1D8 | 0x1D9 | 0x1DA | 0x1DB | 0x1DC | 0x1DD | 0x1DE | 0x1DF |
| 14.0 | 0x1E0 | 0x1E1 | 0x1E2 | 0x1E3 | 0x1E4 | 0x1E5 | 0x1E6 | 0x1E7 | 0x1E8 | 0x1E9 | 0x1EA | 0x1EB | 0x1EC | 0x1ED | 0x1EE | 0x1EF |
| 15.0 | 0x1F0 | 0x1F1 | 0x1F2 | 0x1F3 | 0x1F4 | 0x1F5 | 0x1F6 | 0x1F7 | 0x1F8 | 0x1F9 | 0x1FA | 0x1FB | 0x1FC | 0x1FD | 0x1FE | 0x1FF |

Figure 2

APPARATUS FOR DETECTING A STATE OF OPERATION OF A POWER SEMICONDUCTOR DEVICE

TECHNICAL FIELD

An embodiment of the invention relates generally to electronic power switching and conversion and related methods, and more particularly to an apparatus including a controller configured to protect a power semiconductor device.

BACKGROUND

A power converter is a power supply or power processing circuit that converts an input voltage waveform into a specified output voltage waveform. DC-DC power converters convert a dc input voltage into a dc output voltage. A power converter generally includes a controller to manage an internal operation thereof by controlling a conduction period of a power switch employed therein. Generally, the controller is coupled between an input and output of the power converter in a feedback loop.

The controller typically measures an output characteristic (e.g., an output voltage or an output current, or a combination of an output voltage and an output current) of the power converter and modifies a duty cycle of the power switch. The duty cycle of the power switch is a ratio represented by a conduction period of the switch to a switching period thereof. Thus, if a switch conducts for half of the switching period, the duty cycle for the switch would be 0.5 (or 50 percent). Additionally, as the needs for a load coupled to an output of the power converter dynamically change, (e.g., as a computational load on a microprocessor changes or an incandescent lamp or electromechanical device such as a motor is turned on), the controller is typically configured to dynamically increase or decrease the duty cycle of the power switch to maintain an output characteristic, such as an output voltage, at a desired value.

In an exemplary application, a power converter has the capability to convert an unregulated input voltage supplied by an input voltage source, such as 12 volts supplied by an internal power bus in a data processor, or a higher unregulated voltage, such as 36 volts supplied by an automotive battery in an advanced vehicular application, to a lower, regulated, output voltage, such as 2.5 volts to power an integrated circuit, or 12 volts to power an incandescent lamp or an electronic circuit.

To provide the voltage conversion and regulation functions, a power converter includes power switches such as metal-oxide semiconductor field-effect transistors ("MOSFETs") that are coupled to the input voltage source and periodically switch a reactive circuit element such as an inductor to the voltage source at a switching frequency that may be on the order of several hundred kilohertz or higher.

In conventional power converter designs, it is necessary to provide a level of protection in the power converter for overcurrent, overvoltage, and fault conditions for sensitive internal components such as a power MOSFET, as well as a control strategy to regulate the output characteristic. Substantial effort is often expended in product manufacture to combine MOSFET fabrication technologies with additional features to provide protection mechanisms. For certain protection mechanisms, e.g., for overcurrent protection, additional circuit elements such as a current-sensing resistor are included in the power converter circuit which may add a recognized expense to the end product, particularly for a level of accuracy that may be necessary for such added circuit elements. A sensing element such as an operational amplifier must also be included in the circuit with supporting components to sense, for example, a voltage across the added circuit element. Such sensing elements and supporting circuitry add cost to an end product.

Despite inclusion of such protective mechanisms in power converters and in semiconductor switching arrangements, unsatisfactory system performance and protection often result using conventional design approaches. For example, a circuit providing an overcurrent limit for a power converter or a semiconductor switch coupled to an incandescent lamp often limits current to the lamp during its turn "on." An "off" incandescent lamp can present a resistance to a power converter or a switch that can be less than one-tenth its resistance after its filament is heated to a normal operating temperature. Accordingly, the initial load current flowing to an incandescent load can exceed the steady-state load current by a factor of ten or more. Similar start-up issues are encountered with switching on other loads such as electromechanical devices, e.g., motors and relays. A current-limiting circuit in the power converter or associated with the switch generally limits load current to a level that is usually only modestly greater than the rated load current of the current source, for example, to a current level that may be 20% greater than the rated load current. A current limiting circuit that temporarily shuts down the electrical power source unnecessarily produces interrupted output current pulses that intermittently heat the lamp filament or initiate the operation of the electromechanical device. A current-limiting circuit that tolerates an acceptable level of current overload for the brief period of time, e.g., to heat the lamp filament would provide an improved current limiting arrangement, particularly if a substantial delay would otherwise be imposed on the electrical power source before it is restarted after an interruption.

The inverse situation can result when a power converter operates in a compromised environment, for example, an environment wherein an environmental temperature is higher than a maximum rated environmental temperature. An ordinary current-limiting circuit might not provide a shutdown function when it is required, possibly resulting in an immediate or a delayed power converter or semiconductor switch failure.

Thus, either an unnecessary shutdown or a failure to shutdown a power converter or a semiconductor switch can have untoward consequences for the operation of an electronic system, for example, an electronic system including a microprocessor. Accordingly, there is a need for an improved approach for a protective function that avoids the limitations of conventional protective design approaches, thereby providing improved system reliability and performance as well as reduced system cost.

SUMMARY OF THE INVENTION

In accordance with an exemplary embodiment, an apparatus including a power semiconductor device and a processor coupled to the semiconductor device and a related method are provided. In an embodiment, the processor is configured to provide a control signal to the power semiconductor device to control an output characteristic of the apparatus. The processor models an internal characteristic of the power semiconductor device and alters the control signal if the modeled internal characteristic crosses a threshold value. In an embodiment, a sensor is coupled to the processor to sense a parameter external to the power semiconductor device. The processor is configured to adapt the modeled internal characteristic to the sensed parameter.

BRIEF DESCRIPTION OF THE DRAWINGS

The details of one or more embodiments of the invention are set forth in the accompanying drawings and the description below. Other features, objects, and advantages of the invention will be apparent from the description and drawings, and from the claims. In the figures, identical reference symbols generally designate the same component parts throughout the various views. For a more complete understanding of the invention, reference is now made to the following descriptions taken in conjunction with the accompanying drawings, in which:

FIG. 2 illustrates a memory map for a table of drain currents, constructed according to an exemplary embodiment;

DETAILED DESCRIPTION OF ILLUSTRATIVE EMBODIMENTS

Figure 1:
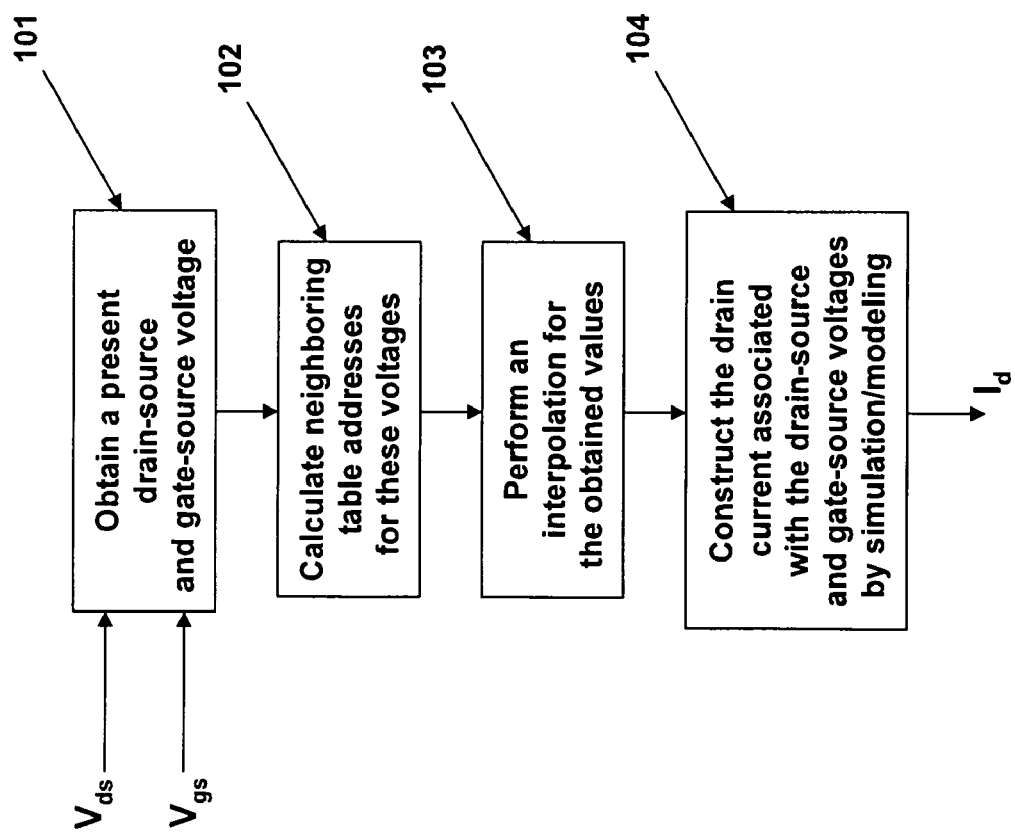
FIG. 1 illustrates a flow diagram showing a computational flow to estimate drain current for a MOSFET from sensed drain-to-source voltage and gate-to-source voltage, constructed according to an exemplary embodiment.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to exemplary embodiments in a specific context, namely an apparatus including a model of an internal characteristic of a power semiconductor device that is constrained to a limited range of values. The apparatus includes a controller responsive to the modeled internal characteristic that produces a control response that limits attained values of the internal characteristic.

The invention may be applied to various control arrangements for an apparatus including a power semiconductor device, and is not limited to the particular implementations described herein. Other apparatuses can be controlled in different contexts using inventive concepts described herein.

To provide accurate management of an operational condition of a power semiconductor device such as a MOSFET in an apparatus such as a power converter or for an on/off semiconductor switching arrangement for a circuit, it is generally beneficial to know a state of an internal device characteristic, such as a channel or junction temperature of the power semiconductor device, and on that basis to modify or adapt a control response, e.g., a control response that may regulate an output characteristic of the apparatus so that the state of the internal device characteristic is maintained with in a limited range.

A general concern in apparatus design is the need to provide a signal representing the internal device characteristic. Such a signal is generally produced employing a sensing device such as a thermistor or a current-sensing resistor that must often be located adjacent to or included within the semiconductor switch to be protected. The use of such a characteristic-sensing device and the frequent need to locate it near or within the semiconductor device produces a cost increment in the end product. As introduced herein, a virtual sensor is formed within or adjacent to a controller that may be located separate from the semiconductor device to be protected that avoids the cost of directly sensing the internal device characteristic.

The control response is advantageously generated in an embodiment that may use a feedback process to regulate an output characteristic. The control response may temporarily not regulate the output characteristic if, for example, the channel temperature in the MOSFET cannot otherwise be maintained below a specification limit. The control response, without limitation, should maintain a current below an overcurrent limit, a voltage below an overvoltage limit, and a device temperature below a specification limit. An overcurrent limit or other operational parameter of the apparatus can be adaptively adjusted in response to a state of operation of an internal device characteristic to provide a desired level of apparatus reliability.

As introduced herein, a process is included in an apparatus to model an internal or otherwise unobserved (including a poorly observed) state of a semiconductor device such as a MOSFET, that can be a standard, off-the-shelf device, using information that can be sensed at an external terminal or a surface of the device. In an embodiment, a digital circuit, analog computer, configurable state machine, microcontroller, digital signal processor, or combination thereof, is employed to model or otherwise represent the internal or otherwise unobserved characteristic of the semiconductor device using, e.g., a model, that may be a highly simplified model, of the device characteristic. The highly simplified model may be represented by a splined curve fit, a look-up table, or other means of representing data over a range of values. The model may be adaptive in the sense that its parameters may be adjusted in view of further data describing the apparatus or its operation that may be obtained. The representation of the internal or otherwise unobserved device characteristic is used by a controller to adapt or alter a control response to maintain a desired level of protection for the apparatus. Furthermore, modeling of an internal device characteristic can provide a higher level of device protection than can be obtained by only sensing an external device characteristic, such as a MOSFET drain-to-source voltage, an output current of the apparatus, or an external device temperature. Accordingly, modeling an internal device characteristic can advantageously provide a higher level of device protection in view of a device operational limit such as a thermal limit that can be functionally related to an operational parameter of the apparatus. For example, by representing an internal device characteristic by modeling, a control response can be adapted to a changing thermal environment of an apparatus, and to the time-dependent response of the device characteristic in relation to a limiting value therefor. In this manner, unnecessary power converter responses such as shutdowns can be avoided, as well as providing necessary shutdowns in a compromised environment such as an obstructed cooling fan or a failure of an air-conditioning unit.

A modeled device characteristic can be represented at any chosen point in time such as a predicted time slightly beyond a real-time computation, and alternative control responses can be compared in view of the modeled/predicted device characteristic. Performance limits for a power converter or other apparatus that ordinarily depend on an inaccessible device characteristic, e.g., a channel temperature, a rate of change thereof, or even an acceleration of a parameter change, can thereby be reliably enforced. A linearized or a temperature-compensated response can advantageously be constructed in response to the modeled device characteristic by running an appropriate software routine.

Recognizing that modeling capabilities can be limited by performance characteristics of a digital signal-processing device and by model parameter inaccuracy, the complexity of a model representing a semiconductor device such as a MOSFET is a result of trade-offs in its design as well as a need for various modeling design approaches. For example, a simplified model of a current-voltage characteristic of a MOSFET can be employed to provide MOSFET drain current as a function of its time-varying drain-to-source voltage and its gate-to-source voltage. The respective equations for such a model are generally known in the art, and are frequently used in circuit simulators. They will not be reviewed herein in the interest of brevity.

To provide a higher level of fidelity for modeling a device characteristic, electrical parasitics may be added to the device model employed therein. For example, parasitic resistance of on-chip wires coupled to a MOSFET die or a Miller capacitance can be included in the device model, e.g., for computation of MOSFET current-voltage characteristics. Forms of respective equations for parasitic circuit parameters such as voltage-dependent Miller capacitances are well known, and can be readily implemented in a device representation.

It is generally recognized that thermal issues play a significant role in the design of an apparatus that includes power electronics. Equations representing a heat flow between a heat source and a heat sink and an associated time-varying thermal response can be included in a model to provide an estimate of a MOSFET channel temperature, particularly if the thermal characteristics of the heat path are known in advance and do not change substantially over time. The resulting thermal response of the device can then be taken into account in producing a control signal for the apparatus.

Making the transition from using a simple current-voltage device characteristic for an apparatus design to including a model of an internal device characteristic to be protected represents a new apparatus design approach. By employing modeling of a selected device characteristic, a device characteristic that was previously inaccessible can now be used in conjunction with observable device characteristics to provide a level of control that provides a higher level of device protection and reduced cost for the end product. Device modeling, as discussed above, can be as simple as a curve fit or a look-up table.

To represent an internal characteristic of a power semiconductor device such as a MOSFET, a nonlinear equation solver can be used off-line to generate representative device characteristics. Explicit equation calculators such as Matlab™/Simulink™ and others are available and can be used to simulate an internal device parameter. The results can then be represented, for example, with a look-up table or with a curve fit, as discussed above, using techniques well known in the art.

A modeling parameter used to represent a real-time internal characteristic of a MOSFET can be adjusted in view of a measured characteristic such as an on resistance of a population of MOSFETs in conjunction with a sensed parameter of the physical environment. Such adjustment of a model parameter can be made in response to the measured population characteristic, or it can be made in real time in response to a sensed parameter of the physical environment to provide enhanced modeling accuracy for the selected characteristic.

In addition to a microcontroller, digital signal processor, etc., which can be used to perform a model for a device characteristic, some additional hardware and design features can be included in an apparatus. For example, a microcontroller, digital signal processor, etc., that performs the modeling can be designed to provide a quick response to control the apparatus, e.g., to provide a time-critical protection response. For example, a rapid value change in an input parameter for a semiconductor device may be detected in parallel with a main processing path so that a related action can be performed, if necessary, in a sufficiently short time interval. Recurring complex calculations can be formed as special command statements of an underlying configurable state machine, i.e., a microcontroller, digital signal processor, etc. Apart from equations that are calculated in the model, a table-based implementation technique can be employed to provide a related functionality. A table may, for example, provide a certain current-voltage characteristic as described further hereinbelow.

To provide a first implementation example using a general-purpose microcontroller or other digital signal-processing device, current-voltage characteristics of a MOSFET are stored in a table, for example, in an EPROM, EEPROM, or ROM of a microcontroller.

Turning now to FIG. 1, illustrated is a flow diagram of an embodiment showing a computational flow to obtain drain current for a MOSFET from sensed drain-to-source voltage and gate-to-source voltage. The process flow illustrated in FIG. 1 is as follows:

101: Obtain present drain-to-source voltage $V_{ds}$ and gate-to-source voltage $V_{gs}$.
102: Calculate neighboring table addresses for these voltages.
103: Perform interpolation for the obtained values.
104: Construct the drain current $I_d$ associated with the drain-to-source and gate-to-source voltages by simulation or modeling.

Turning now to FIG. 2, illustrated is an embodiment of an exemplary memory map for a table of drain currents in which a memory address points to a respective memory cell holding a related value for a drain current, $I_d$. For example, the result for a drain-to-source voltage $V_{ds}$=10.3 volts and a gate-to-source voltage $V_{gs}$=8.7 volts would be produced by interpolation of values in the associated memory cells, i.e., the four memory cells associated with drain-to-source voltages of 10 and 11 volts, and gate-to-source voltages of 8 and 9 volts.

In addition to a tabular representation of values for a drain current $I_d$, a nonlinear representation of MOSFET drain-current regions with characteristics that exhibit a high gradient of responses may also be employed.

An embodiment of a process is now described for protection of a MOSFET overtemperature condition in which MOSFET drain current is limited or shut off, if necessary, in response to a modeled channel temperature. An apparatus control strategy is adjusted in view of the temperature headroom between modeled channel temperature, the rate of change of channel temperature, and a specified temperature limit. It is contemplated that a load condition and other factors can also be used in the computation. In this manner, a maximum internal operating temperature of a device which is subject to rapid device parameter changes and which is unobservable can be safely limited. Adaptive regulation of MOSFET drain current can thus be provided in response to the modeled device temperature.

Figure 3:
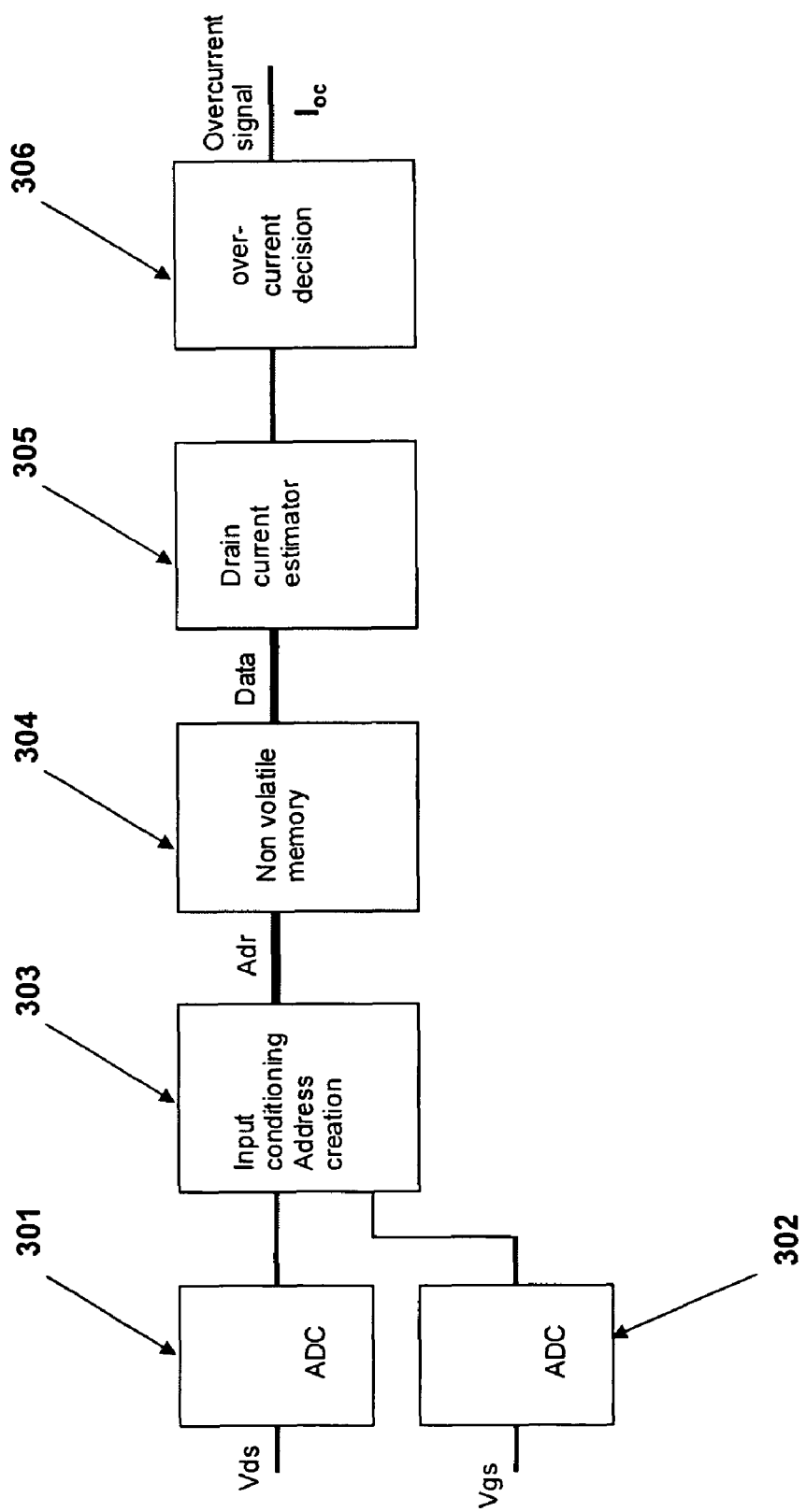
FIG. 3 illustrates a block diagram of a process to produce an overcurrent signal to limit a MOSFET drain current, constructed according to an exemplary embodiment.

Turning now to FIG. 3, illustrated is a block diagram of an embodiment of a process to produce an overcurrent signal $I_{oc}$ to limit a MOSFET drain current. The process employs an exemplary architecture based on analog-to-digital converters ("ADCs") 301 and 302 to sense MOSFET drain-to-source voltage, $V_{ds}$, and MOSFET gate-to-source voltage, $V_{gs}$, and digital logic (in blocks 303, 305, and 306) coupled to a nonvolatile memory (in block 304). The process computes the overcurrent signal $I_{oc}$. The Input Conditioning Address Creation block 303 filters digital data produced by analog-to-digital converters 301 and 302 that represent sensed voltages, and identifies addresses, Adr, in nonvolatile memory 304 in which to store sensed voltage data. The sensed voltage data are used in the Drain Current Estimator block 305 with equations representing a MOSFET model to produce a time sequence of MOSFET drain current data. Preferably, the Drain Current Estimator block 305 produces MOSFET drain current data from any of the commonly available analytic representations of MOSFET drain current as it depends on gate-to-source and drain-to-source voltages. The overcurrent signal $I_{oc}$ is thereby produced in response to the sensed drain-to-source and gate-to-source voltages of the MOSFET.

As an example of estimating MOSFET channel temperature $T_{ch}$, the equation below can be used to estimate the instantaneous power p(t) dissipated in the channel, $$p(t) = I_{ds} \cdot V_{ds}$$

where $I_{ds}$ is MOSFET drain current and $V_{ds}$ is MOSFET drain-to-source voltage. The power p(t) dissipated in the MOSFET is used, as indicated by the equation below, to express the derivative of the MOSFET channel temperature $T_{ch}(t)$ as a function of the temperature difference between the MOSFET channel temperature and an assumed temperature $T_{amb}$ of the ambient surroundings:

$$\frac{d}{dt}T_{ch} = \frac{p(t) - (T_{ch} - T_{amb})/R_{th}}{c \cdot m}.$$

In the equation above, $R_{th}$ is the thermal resistance of the path from the channel to ambient surroundings, and c and m, respectively, are a specific heat and a mass that are representative of the thermal response of the MOSFET channel. The equation above can be integrated to produce a current value for the estimate of the channel temperature $T_{ch}$. Thus, by using a process such as represented by the equations above, a rapidly fluctuating channel temperature can be estimated, that otherwise would be unobservable with an ordinary heat sensing device such as a thermistor located externally to the MOSFET.

The predicted temperature $T_{ch\_P}$ of the MOSFET channel at a time $\Delta T$ seconds briefly in the future, such as a few milliseconds in the future, can be predicted using the equation:

$$T_{ch\_P} = T_{ch} + \frac{d}{dt}T_{ch} \cdot \Delta T.$$

An overcurrent limit $I_{oc}$ such as produced by the Overcurrent Decision block 306 in FIG. 3 can then be adjusted in response to the predicted channel temperature $T_{ch\_P}$, for example by the equation:

$$\frac{d}{dt}I_{oc} = -k \cdot (T_{ch\_P} - T_{ch\_LIMIT} - \Delta T_h),$$

where $T_{ch\_LIMIT}$ is a maximum allowable channel temperature for the device, k is a constant of proportionality, and $\Delta T_h$ is temperature headroom that can be employed to provide a level of apparatus reliability. The overcurrent limit is accordingly adaptively adjusted in view of the predicted channel temperature.

Although the description of the process above is directed to representing the temperature of a MOSFET channel, it is not inherently limited to representing the temperature (or other characteristic) of a single device. It and the further discussion below can be readily adapted using techniques well known in the art to representing a plurality of MOSFET channels and/or a plurality of semiconductor devices.

The equation above is integrated to find a current value for the overcurrent limit $I_{oc}$. The following equation can be employed to provide a maximum upper value $I_{oc\_max}$ for the overcurrent limit to provide a further protective process to achieve apparatus reliability:

$$I_{oc} \leq I_{oc\_max}.$$

The overcurrent decision block 306 illustrated in FIG. 3 thus computes an overcurrent signal $I_{oc}$ that adaptively limits output current of the power converter.

Figure 4:
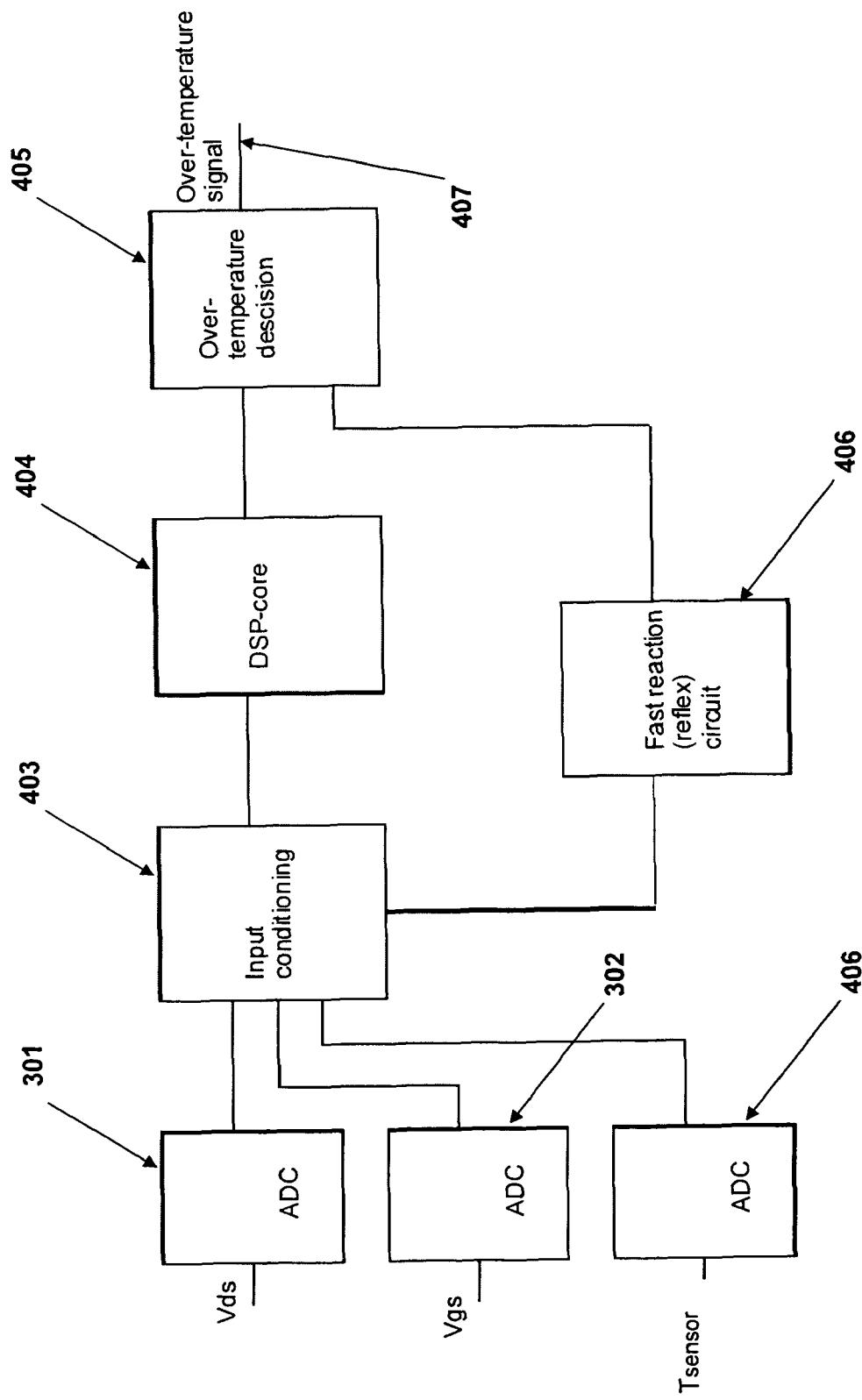
FIG. 4 illustrates a block diagram of a process to produce an overtemperature signal in response to sensed MOSFET drain-to-source and gate-to-source voltages and a sensed temperature that may be sensed remotely from the MOSFET, constructed according to an exemplary embodiment.

The next example describes a further exemplary embodiment that provides overcurrent and overtemperature protection for an apparatus including sensing of off-chip temperature. Turning now to FIG. 4, illustrated is a block diagram of a process to produce an overtemperature signal 407, such as the predicted MOSFET channel temperature $T_{ch\_P}$, in response to sensed MOSFET drain-to-source and gate-to-source voltages and a sensed off-chip temperature, $T_{off\_chip}$. The process again employs an exemplary architecture based on analog-to-digital converters 301 and 302 to sense MOSFET drain-to-source voltage, $V_{ds}$, and gate-to-source voltage, $V_{gs}$, as described hereinabove with reference to FIG. 3. ADC converter 406 senses the off-chip temperature with a thermistor located in the proximity of, or adjacent to, the MOSFET.

Digital logic (blocks 403, 404, 405, and 406) and nonvolatile memory (e.g., similar to block 304 illustrated in FIG. 3, but not shown in FIG. 4) are employed to compute predicted MOSFET channel temperature $T_{ch\_P}$. The Input Conditioning block 403 filters the data produced by analog-to-digital converters 301 and 302 and identifies addresses in nonvolatile memory 304 in which to store the sensed voltage data.

To estimate channel temperature $T_{ch}$, dissipated MOSFET power p(t) is calculated as described previously hereinabove, and the thermal resistance $R_{th}$ of the path from the channel to the ambient surroundings is used to represent heat flow out of the channel to the ambient surroundings. The temperature of the ambient surroundings reflects the actual thermal environment of the apparatus, as it is affected by the operation of cooling fans and air conditioning units.

A microprocessor, DSP, or other digital circuit, without limitation, can be used for the computation. The rate of change of a device temperature such as a channel temperature is generally slow compared to a rate of change of externally sensed device voltages and the rate of calculation that can be performed with digital computation. In FIG. 4, DSP-core block 404 is a digital processor that performs this computation, preferably with fast signal processing structures such as a fast multiply operation.

The fast-reaction circuit path illustrated in FIG. 4 bypasses the path of digital computation if that path is too slow in execution to provide a quick response, for example to a steep current rise that can adversely affect a device internal temperature or other device property. If a steep current rise is detected, then a predetermined or quickly calculated current limit can be produced for input to the Overtemperature Decision block 405, bypassing the more detailed computation in the device model.

The Overtemperature Decision block 405 produces an overcurrent signal $I_{oc}$, for example as described previously above, to provide a limit for the power converter output current.

In addition to modeling an internal device characteristic, further testing of possible control responses, preferably in real-time, can be performed by a power converter controller to assess the effect on a load by forcing a modeled control response and observing modeled load responses as well as the response of an internal device characteristic. A control action can be selected that provides suitable control of an apparatus output characteristic while maintaining an unobservable internal device characteristic below a limiting value.

Figure 5:
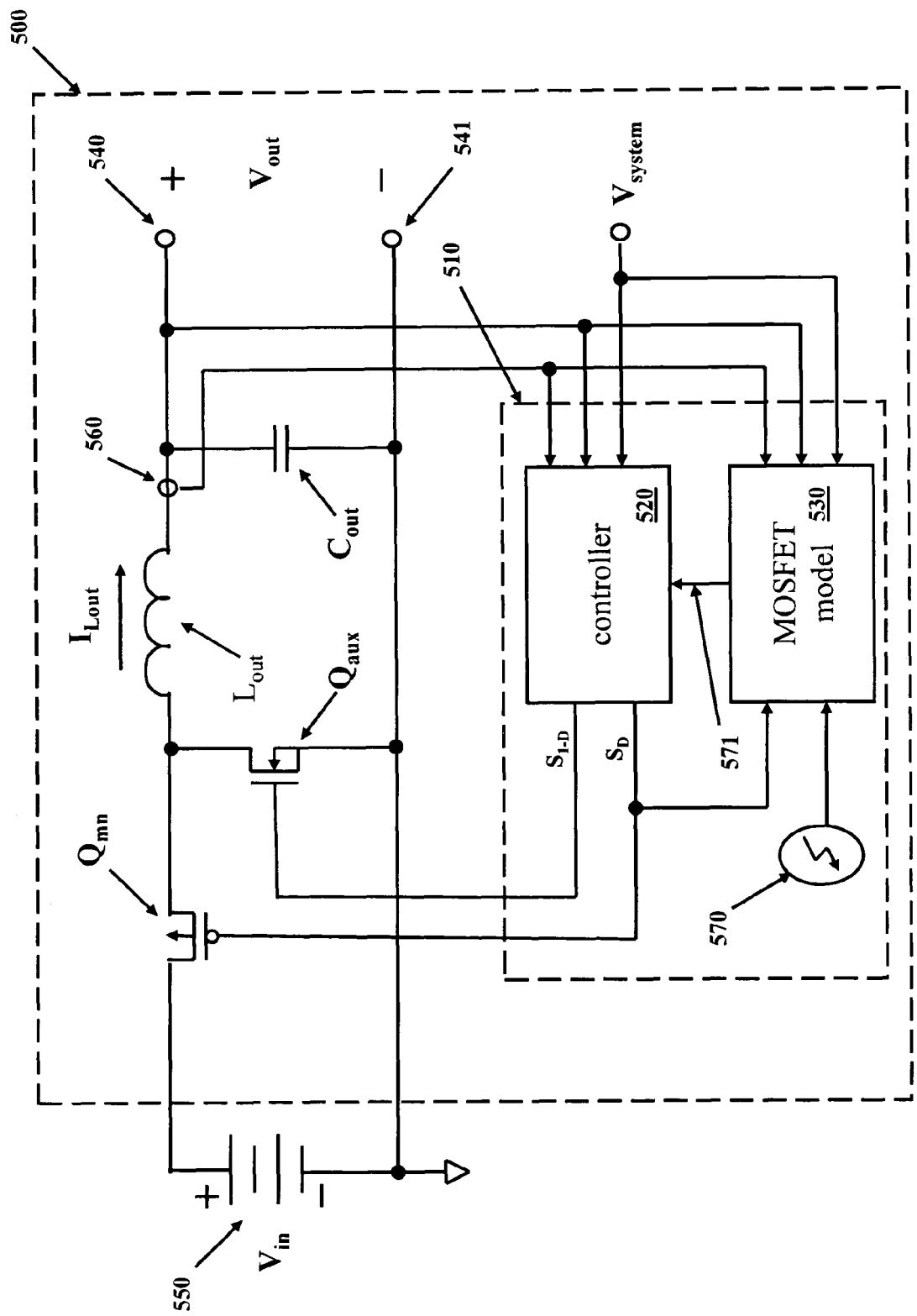
FIG. 5 illustrates a simplified schematic drawing of a power train of a power converter that illustrates application of the principles introduced herein.

Referring now to FIG. 5, illustrated is a simplified schematic diagram of an embodiment of a power train of a power converter 500 that illustrates application of principles introduced herein. The power converter includes a controller 520 that regulates a power converter output characteristic such as an output voltage. The power converter further includes a main power switch $Q_{mn}$ implemented with a power MOSFET. The power converter further includes a model (that may be formed with a look-up table, curve fit, etc.) in block 530 that produces an estimate of the channel temperature of the main power switch $Q_{mn}$. The estimate of MOSFET channel temperature is provided to controller 520 on lead 571. The power converter provides power to a system/load (not shown) coupled to output terminals 540 and 541. While in the illustrated embodiment the power train employs a buck converter topology, those skilled in the art should understand that other converter topologies are well within the broad scope of the present invention. The power converter includes a processor 510 that performs the operations of the controller and the model.

The power train of the power converter receives an input voltage $V_{in}$ from a source of electrical power (represented by battery 550) at an input thereof, and provides a regulated output voltage $V_{out}$ or other output characteristic at output terminals 540 and 541. In keeping with the principles of a buck converter topology, the output voltage $V_{out}$ is generally less than the input voltage $V_{in}$ such that a switching operation of the power converter can regulate the output voltage $V_{out}$.

During a first portion D of a high-frequency switching cycle, the main power switch $Q_{mn}$ (e.g., a p-channel MOSFET), is enabled to conduct in response to a gate drive signal $S_D$ for a primary interval, coupling the input voltage $V_{in}$ to an output filter inductor $L_{out}$. During the a first portion D of the switching cycle, an inductor current $I_{Lout}$ flowing through the output filter inductor Lout increases as current flows from the input to the output of the power train. An ac component of the inductor current $I_{Lout}$ is filtered by the output capacitor $C_{out}$.

During a second portion 1-D of the switching cycle, the main power switch $Q_{mn}$ is transitioned to a non-conducting state and an auxiliary power switch $Q_{aux}$ (e.g., an n-channel MOSFET), coupled to the output filter inductor $L_{out}$, is enabled to conduct in response to a gate drive signal $S_{1-D}$. The auxiliary power switch $Q_{aux}$ provides a path to maintain continuity of inductor current $I_{Lout}$ flowing through the output filter inductor $L_{out}$. Of course, a current path provided by a diode, which could be a body diode of a MOSFET, would be included in the circuit to assure continuity of current flow through the output filter inductor $L_{out}$ if all active power switches should be disabled to conduct. During the second portion 1-D of the switching cycle, the inductor current $I_{Lout}$ flowing through the output filter inductor $L_{out}$ decreases. In general, the duty cycle of the main power switch $Q_{mn}$ and the auxiliary power switch $Q_{aux}$ may be adjusted to regulate the output voltage $V_{out}$ of the power converter. Those skilled in the art should understand, however, that the conduction periods for the two power switches may be separated by a small time interval to avoid cross conduction therebetween, and beneficially to reduce the switching losses associated with the power converter.

The controller 520 of the power converter receives the output voltage $V_{out}$ of the power converter and is coupled to a desired output characteristic such as a desired system voltage $V_{system}$.

In a switch-mode power converter such as the buck power converter illustrated and described with reference to FIG. 5, the duty cycle D of the main power switch $Q_{mn}$ determines the steady-state ratio of a power converter output voltage $V_{out}$ to its input voltage $V_{in}$. In particular, for a buck power converter typology operating in a continuous conduction mode, duty cycle determines the ratio of output voltage to input voltage (ignoring certain losses within the power converter) according to the equation:

$$D=V_{out}/V_{in}.$$

In an alternative power converter typology, such as a boost topology, duty cycle may determine the ratio of output voltage to input voltage according to another equation.

The MOSFET model 530 is coupled to a temperature-sensing element 570 that is preferably included in or located adjacent to processor 510. By including the temperature-sensing element in or adjacent to processor 510 and modeling the temperature response of the semiconductor device, a virtual temperature-sensing mechanism is thereby created. This advantageously avoids the cost of a temperature-sensing device in thermal contact with the semiconductor device. The temperature-sensing element 570 can be implemented with a thermistor or other temperature-sensing device. The MOSFET model 530 is also coupled to signals sensing operational characteristics of the circuit, such as output voltage $V_{out}$, the current in output filter inductor $L_{out}$ (sensed with current sensor 560), and the gate drive signal for the main power switch $Q_{mn}$. MOSFET model 530 produces an estimate of the channel temperature of the main power switch $Q_{mn}$ on lead 571 from these signals, for example, as described previously hereinabove. The controller 520 produces the control signals $S_D$ and $S_{1-D}$ to maintain the channel temperature of the main power switch $Q_{mn}$ below a temperature limit. For example, the output current (or a current in the output filter inductor) can be limited or stopped based on sensing a current exceeding the current limit computed as described previously herein above. The switching action, i.e., the duty cycle, of the main power switch (and that out of an auxiliary power switch) can be disabled to limit or stop apparatus/power converter output current.

The concept has been introduced of modeling an internal characteristic of a power semiconductor device in an apparatus, and altering a control signal therefor if the modeled internal characteristic crosses a threshold value. In accordance with one exemplary embodiment, the power semiconductor device is operated as a high-side switch or a low-side switch. In accordance with one exemplary embodiment, a processor coupled to the power semiconductor device is configured to provide a control signal therefor to regulate an output characteristic of the apparatus. In an embodiment, the processor models an internal characteristic of the power semiconductor device and alters the control signal if the modeled internal characteristic crosses a threshold value. In an embodiment, the processor disables conductivity of the power semiconductor device if the modeled internal characteristic crosses a threshold value. In an embodiment, the apparatus is a power converter. In an embodiment, the power semiconductor device is a MOSFET, and the internal characteristic is a channel temperature of the MOSFET. In an embodiment, the internal characteristic includes a time derivative of a device internal parameter such as a time derivative of a channel temperature. In an embodiment, the processor is a digital processor.

In a further embodiment, a sensor is coupled to the processor, and the sensor is configured to sense a parameter external to the power semiconductor device. In an embodiment, the sensor is located in or adjacent to the processor. The processor is configured to adapt the modeled internal characteristic to the sensed parameter. In an embodiment, the sensor is a thermistor. In an embodiment, the processor limits an output current of the apparatus in response to the modeled internal characteristic. The processor may limit an output current of the apparatus to a maximum upper limit in response to the modeled internal characteristic Another exemplary embodiment provides a method of controlling a power semiconductor device in an apparatus. The power semiconductor device may regulate an output characteristic of the apparatus, or it may be a high-side or low-side switch configured to enable or disable current flow in a circuit. In an embodiment, the method includes modeling an internal characteristic of the power semiconductor device, and altering a control signal therefor if the modeled internal characteristic crosses a threshold value. In an embodiment, the method includes coupling a sensor that may be a thermistor to the processor and sensing a parameter external to the power semiconductor device. In an embodiment, the method includes configuring the processor to adapt the modeled internal characteristic to the sensed parameter. In an embodiment, the method includes limiting an output current of the apparatus in response to the modeled internal characteristic. In an embodiment, the method includes limiting an output current of the apparatus to a maximum upper limit in response to the modeled internal characteristic.

In an embodiment, the method includes forming the apparatus as a power converter. In an embodiment, the method includes using a MOSFET for the power semiconductor device. In an embodiment, the method includes modeling a channel temperature of the MOSFET as the internal characteristic. In an embodiment, the method includes using a digital processor for the processor. In an embodiment, the method includes disabling conductivity of the power semiconductor device if the modeled internal characteristic crosses a threshold value. In an embodiment the internal characteristic includes a time derivative of a device internal parameter such as the time derivative of a channel temperature.

Although a processor modeling an internal characteristic of a power semiconductor device to enable reliable control thereof and related methods have been described for application to a power converter, it should be understood that other applications of a process to protect a power semiconductor device, such as a power semiconductor device utilized in a circuit interrupting function, are contemplated within the broad scope of the invention, and need not be limited to power converters.

Although the invention has been shown and described primarily in connection with specific exemplary embodiments, it should be understood by those skilled in the art that diverse changes in the configuration and the details thereof can be made without departing from the essence and scope of the invention as defined by the claims below. The scope of the invention is therefore determined by the appended claims, and the intention is for all alterations that lie within the range of the meaning and the range of equivalence of the claims to be encompassed by the claims.

What is claimed is:

1. An apparatus, comprising:
a power semiconductor device;
a temperature sensor disposed outside of the power semiconductor device; and
a processor coupled to the power semiconductor device and the temperature sensor, wherein the processor is configured
to provide a control signal coupled to the power semiconductor device to control a conductive state of the power semiconductor device,
to model an output current of the power semiconductor device based on a voltage of the power semiconductor device, and
to model an internal temperature of the power semiconductor device based on an output of the temperature sensor and the modeled output current, wherein the processor alters the control signal if the modeled internal temperature crosses a threshold value.

2. The apparatus as claimed in claim 1, wherein the apparatus is a power converter.

3. The apparatus as claimed in claim 1, wherein the power semiconductor device is operated as a high-side switch.

4. The apparatus as claimed in claim 1, wherein the power semiconductor device is a MOSFET.

5. The apparatus as claimed in claim 4, wherein the internal temperature is a channel temperature of the MOSFET.

6. The apparatus as claimed in claim 1, wherein the processor is a digital processor.

7. The apparatus as claimed in claim 1, wherein the processor disables conductivity of the power semiconductor device when the modeled internal temperature crosses the threshold value.

8. The apparatus as claimed in claim 1, wherein the processor is configured to adapt the modeled internal temperature to the measured parameter.

9. The apparatus as claimed in claim 8, wherein the temperature sensor is a thermistor.

10. The apparatus as claimed in claim 1, wherein the processor limits an output current of the apparatus in response to the modeled internal temperature.

11. The apparatus as claimed in claim 10, wherein the processor limits the output current of the apparatus to a maximum upper limit in response to the modeled internal temperature.

12. A method of controlling an output characteristic of an apparatus including a processor coupled to a power semiconductor device, the method comprising:
controlling the power semiconductor device with the processor to control the output characteristic of the apparatus;
sensing an external temperature of the power semiconductor device with a temperature sensor coupled to the processor;
sensing voltages of the power semiconductor device;
modeling an output current of the semiconductor device based on the sensed voltages;

modeling an internal temperature of the power semiconductor device using the sensed external temperature and voltages of the power semiconductor device; and altering controlling the power semiconductor device if the modeled internal temperature crosses a threshold value.

13. The method as claimed in claim 12 wherein the apparatus is a power converter.

14. The method as claimed in claim 12, wherein the power semiconductor device is operated as a high-side switch.

15. The method as claimed in claim 12, wherein the power semiconductor device is a MOSFET.

16. The method as claimed in claim 15, wherein the internal temperature is a channel temperature of the MOSFET.

17. The method as claimed in claim 12, wherein the processor is a digital processor.

18. The method as claimed in claim 12, wherein altering controlling the power semiconductor device comprises disabling connectivity of the power semiconductor device if the modeled internal temperature crosses the threshold value.

19. The method as claimed in claim 12, further comprising adapting the modeled internal device temperature to the sensed external temperature.

20. The method as claimed in claim 19, wherein the external temperature is measured with a thermistor.

21. The method as claimed in claim 12, including using the modeled internal temperature to limit an output current of the apparatus.

22. The method as claimed in claim 21, including limiting the output current to a fixed upper limit.

23. The apparatus of claim 1, wherein:
the processor models the internal temperature by
calculating an internal power based on the voltage of the power semiconductor device and the modeled output current of the semiconductor device; and
using a thermal resistance and the calculated internal power to determine a heat flow out of the power semiconductor device.

24. The method of claim 12, wherein modeling the internal temperature of the power semiconductor device comprises:
calculating an internal power based on the voltage of the power semiconductor device and the modeled output current of the semiconductor device; and
using a thermal resistance and the calculated internal power to determine a heat flow out of the power semiconductor device.

25. The method of claim 12, wherein modeling the output current comprises providing sensed voltages to a lookup table and receiving the modeled current from the lookup table.

26. The method of claim 21, wherein using the modeled internal temperature to limit an output current comprises:
calculating an internal power based on the voltage of the power semiconductor device and the modeled output current of the semiconductor device;
estimating a future internal temperature based on the calculated internal power; and
calculating an overcurrent limit based on the estimated future internal temperature.

27. The method of claim 26, wherein estimating the future internal temperature comprises using the expressions:

$$\frac{d}{dt}T_{ch} = \frac{p(t) - T_{ch} - T_{amb})/R_{th}}{c \cdot m}; \text{ and}$$

$$T_{ch\_P} = T_{ch} + \frac{d}{dt}T_{ch} \cdot \Delta T,$$

where p(t) is the calculated internal power, $T_{ch\_P}$ is the estimated future internal temperature, $T_{ch}$ is a present internal temperature estimate, $T_{amb}$ is the sensed external temperature, $R_{th}$ is a thermal resistance, c is a specific heat, m is a mass representative of a thermal response of the semiconductor device, and $\Delta T$ is a time increment.

28. The method of claim 27, wherein calculating the overcurrent limit comprises using the following expression, $$\frac{d}{dt}I_{OC} = -k \cdot (T_{ch\_P} - T_{ch\_LIMIT} - \Delta T_h),$$

where $$\frac{d}{dt}I_{OC}$$

is a derivative of the overcurrent limit, k is a constant of proportionality, $T_{ch\_LIMIT}$ is a maximum allowable temperature for the semiconductor device, and $\Delta T_h$ is a temperature headroom.

* * * * *